(12) United States Patent
Havel et al.

(10) Patent No.: US 8,148,001 B2
(45) Date of Patent: Apr. 3, 2012

(54) DEVICES FOR STORING ENERGY IN THE MECHANICAL DEFORMATION OF NANOTUBE MOLECULES AND RECOVERING THE ENERGY FROM MECHANICALLY DEFORMED NANOTUBE MOLECULES

(75) Inventors: Timothy F. Havel, Boston, MA (US); Carol Livermore-Clifford, Framingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 727 days.

(21) Appl. No.: 11/779,545

(22) Filed: Jul. 18, 2007

(65) Prior Publication Data
US 2008/0305386 A1 Dec. 11, 2008

Related U.S. Application Data

(60) Provisional application No. 60/836,427, filed on Aug. 8, 2006.

(51) Int. Cl.
*H01M 10/00* (2006.01)
*H02K 35/00* (2006.01)
(52) U.S. Cl. ....................... 429/122; 977/725; 310/12.03
(58) Field of Classification Search .................. 429/122; 977/725, 731; 310/12.03, 152
See application file for complete search history.

(56) References Cited

U.S. PATENT DOCUMENTS

| | | | |
|---|---|---|---|
| 3,354,383 A | 11/1967 | Weismann | |
| 6,557,877 B2 | 5/2003 | Dunkley | |
| 6,559,550 B2 | 5/2003 | Herman | |
| 6,593,666 B1 | 7/2003 | Pinkerton | |
| 2004/0239210 A1* | 12/2004 | Pinkerton et al. | 310/309 |
| 2006/0118782 A1 | 6/2006 | Zettl | |
| 2009/0315011 A1* | 12/2009 | Bertin et al. | 977/725 X |

FOREIGN PATENT DOCUMENTS

| | | |
|---|---|---|
| EP | 1671922 | 6/2006 |
| GB | 2262324 | 6/1993 |
| JP | 2006136185 | 5/2006 |
| WO | 02080360 | 10/2002 |

OTHER PUBLICATIONS

Chesnokov et al., "Mechanical Energy Storage in Carbon Nanotube Springs" Physical Review Letters, vol. 82, No. 2, Jan. 11, 1999, The American Physical Society, pp. 343-346.
Yu et al., "Strength and Breaking Mechanism of Multiwalled Carbon Nanotubes under Tensile Load" Science vol. 287, Jan. 28, 2000, pp. 637-640.
Cao et al., "Super-Compressible Foamlike Carbon Nanotube Films" Science, vol. 310, Nov. 25, 2005, pp. 1307-1310.
Korgel, "Nanospring Take Shape" Science, Sep. 9, 2005, pp. 1683-1684.
Papadakis et al., "Resonant Oscillators with Carbon-Nanotube Torsion Springs" Physical Review Letters, vol. 93. No. 14, Oct. 1, 2004, pp. 146101-146101-4.

* cited by examiner

*Primary Examiner* — Stephen J. Kalafut
(74) *Attorney, Agent, or Firm* — Gesmer Updegrove LLP

(57) ABSTRACT

An energy storage device includes at least one nanotube. An energy storage mechanism converts energy external to the device into the appropriate levels of strain on the at least one nanotube to produce stored energy, and an energy recovery mechanism converts the energy released by relaxing the at least one nanotube back to energy external to the device.

16 Claims, 7 Drawing Sheets

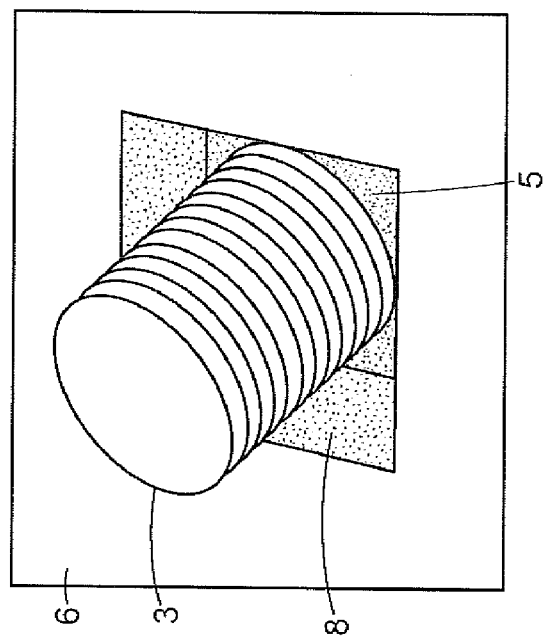
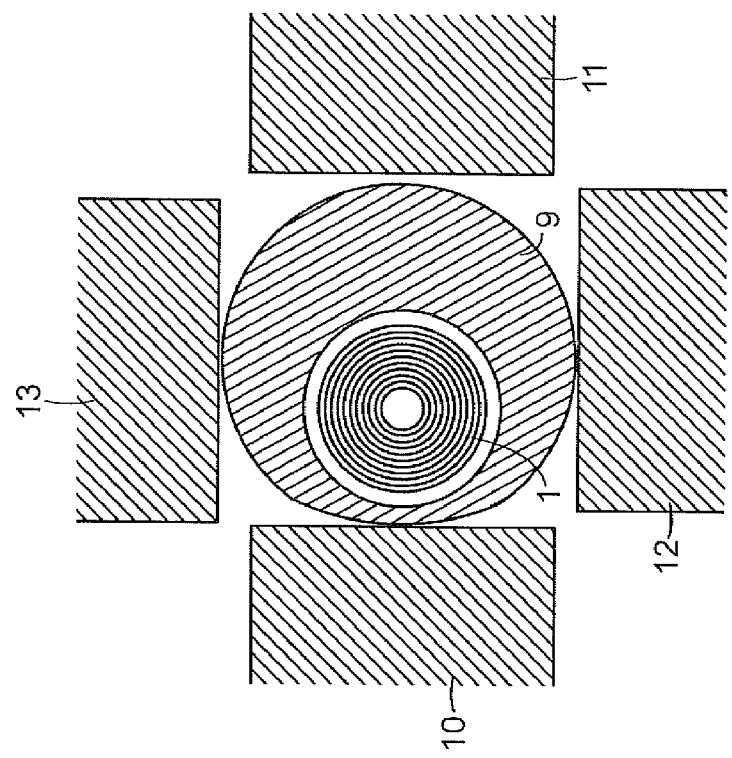

DEVICES FOR STORING ENERGY IN THE MECHANICAL DEFORMATION OF NANOTUBE MOLECULES AND RECOVERING THE ENERGY FROM MECHANICALLY DEFORMED NANOTUBE MOLECULES

PRIORITY INFORMATION

This application claims priority from provisional application Ser. No. 60/836,427 filed Aug. 8, 2006, which is incorporated herein by reference in its entirety.

BACKGROUND OF THE INVENTION

The invention relates to the field of energy storage, in particular to storing energy in the precisely controlled mechanical deformation of single or highly ordered assemblies of nanotube molecules, and to recovering it at a later time in order to perform useful work, for example to power an electronic device or a motor vehicle.

The deformation of elastic springs, made for example out of rubber or steel, is one of the oldest and best-known forms of energy storage. It has been widely used to power clocks and wrist watches as well as, albeit much less widely, a means of powering electronic devices such as radios (Trevor Baylis, UK patent #2,262,324 A) or vehicles such as bicycles (Jason Dunkley, U.S. Pat. No. 6,557,877 B2). The advantages of mechanical springs over other forms of small-scale, portable energy storage include high reliability, durability, and efficiency. Their disadvantage lies in their relatively low energy storage density, which is about 600 Joule per liter for steel springs. This value has improved only modestly over the last century, despite the progress that has been made in materials science.

The discovery and development of methods for synthesizing nanotube molecules has greatly changed the prospects for improving the energy storage density of mechanical springs, at least at the microscopic scale. It is well-known, for example, that in the continuum limit the mechanical properties single carbon nanotubes would make extremely good springs. It has however been quite difficult to demonstrate these properties experimentally, although suggestive studies have been performed on the compression of highly disordered macroscopic assemblies of carbon nanotubes ("Mechanical Energy Storage in Carbon Nanotube Springs," S. A. Chesnokov, V. A. Nalimova, A. G. Rinzler, R. E. Smalley and J. E. Fischer, *Physical Review Letters* 82, 343-346, 1999) as well as on the imprecisely controlled tension of single nanotubes ("Strength and Breaking Mechanism of Multiwalled Carbon Nanotubes under Tensile Load," Min-Feng Yu, O. Lourie, M. J. Dyer, K. Moloni, T. F. Kelly and R. S. Ruoff, *Science Magazine* 287, 637-640, 2000). It has further been suggested that films of aligned carbon nanotubes could be useful in absorbing shocks (see for example "Super-Compressible Foamlike Carbon Nanotube Films," A. Cao, P. L. Dickrell, W. G. Sawyer, M. N. Ghasemi-Nejhad and P. M. Ajayan, *Science Magazine* 310, 1307-1310, 2005). Finally, it has recently been shown that synthesis of nanotubes within Micro-Electro-Mechanical Systems (MEMS) facilitates the precise positioning of single or formation of microscale assemblies of multiple nanotubes (see e.g. Anastasios John Hart, "Chemical, Mechanical and Thermal Control of Substrate-Bound Carbon Nanotube Growth," Massachusetts Institute of Technology Ph.D. dissertation, 2006).

What has not been accomplished or even attempted is to use the mechanical deformation of single or assemblies of multiple nanotube molecules, either carbon, boron nitride or any other elemental composition, as a means of storing energy for subsequent practical uses. In order to do this, it is necessary to either manipulate large numbers of isolated, noninteracting, single nanotube molecules with submicron precision, or to apply large forces to dense, highly ordered assemblies of many interacting nanotube molecules which may be millimeters in overall size. The object of this invention is to utilize the mechanical deformation of nanotube molecules or highly ordered assemblies of such as a means of storing energy and subsequently using that energy for such practical purposes as powering machinery or electronic devices.

SUMMARY OF THE INVENTION

According to one aspect of the invention, there is provided an energy storage device. The energy storage device includes at least one nanotube. An energy storage and recovery mechanism applies the appropriate levels of strain on the at least one nanotube to produce stored energy and relaxes the at least one nanotube to recover the energy for use external to the energy storage device.

According to another aspect of the invention, there is provided a method of forming an energy storage device. The method includes providing at least one nanotube. Also, the method includes forming an energy storage and recovery mechanism for applying the appropriate levels of strain on the at least one nanotube to produce stored energy and relaxing the at least one nanotube to recover the energy for use external to the energy storage device According to another aspect of the invention, there is provided method of producing mechanical energy in or transferring mechanical energy to an energy storage device. The method includes providing at least one nanotube and allowing the elasticity of the at least one nanotube to convert the mechanical energy into the appropriate levels of strain on the at least one nanotube to produce stored energy. Also, the method includes allowing the elasticity of the at least one nanotube to relax the appropriate levels of strain and recover the mechanical energy for use external to the energy storage device.

BRIEF DESCRIPTION OF THE DRAWINGS

FIGS. 1A-1C are schematic diagrams illustrating a multi-walled nanotube molecule stretched between two screws by a electro-mechanical transducer (EMT) based on the piezo-electric effect;

DETAILED DESCRIPTION OF THE INVENTION

Figure 1A:
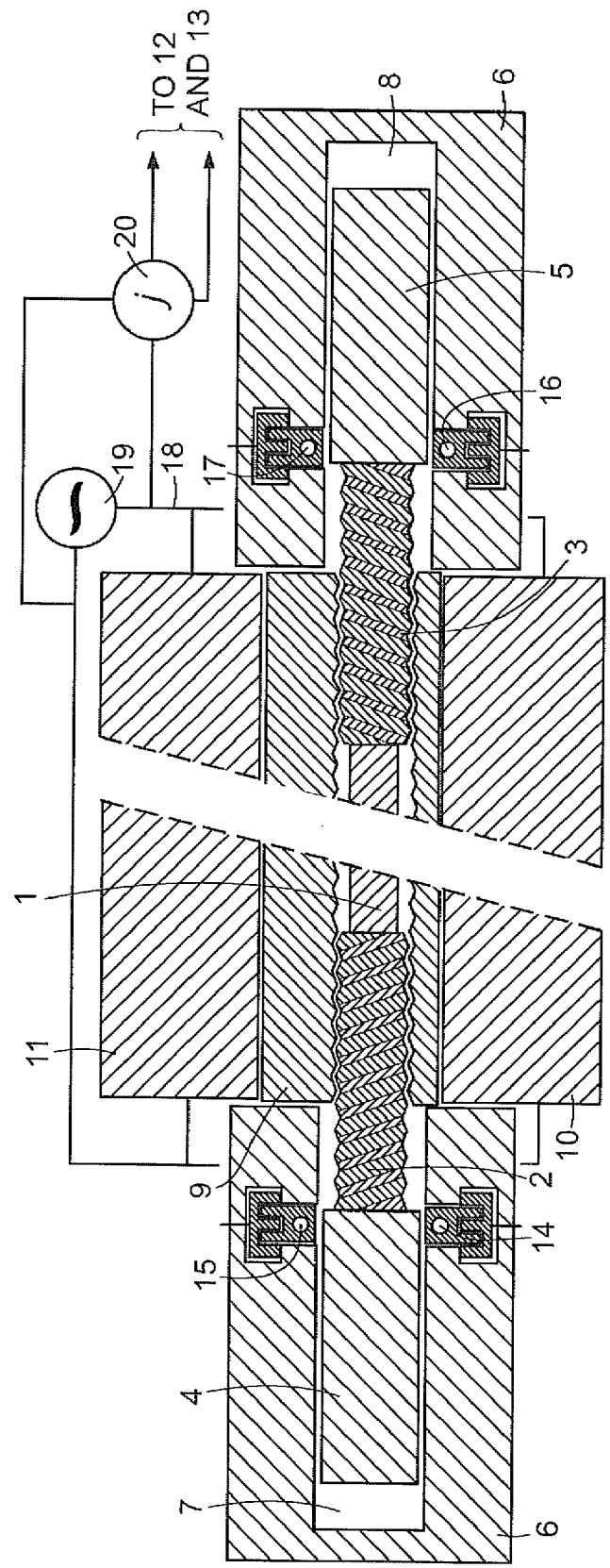

The invention provides a technique to utilize nanotubes as "super-springs" in which one can store and from which one can recover energy for subsequent use, either directly in the form of mechanical energy or in the form of electricity generated from this mechanical energy. The technical rational for this new use of nanotubes is as follows.

Nanotube molecules are not only several times stiffer than steel, but they are also far more flexible than steel. In addition, nanotubes are not prone to fatigue from repeated use, as metal springs are. Since the energy stored in any spring is approximately proportional to the stiffness and to the square of the displacement, these two facts together imply that it should be possible to store much more energy in a spring composed entirely or largely of nanotube molecules than it would be in any other known kind of spring of comparable size and weight.

An estimate of the maximum energy density of a nanotube spring is readily obtained using the linear theory of elasticity, namely $$E=(\tfrac{1}{2})Y \cdot X^2,$$

where Y is Young's modulus and X is its fractional change in volume. The Young's modulus of the most common kind of nanotube, namely carbon, is known to be of order one tera-Pascal, assuming a wall thickness equal to the distance between the sheets of graphite (about 0.34 nm). It is widely accepted that high quality (i.e. low defect) carbon nanotubes can be reversibly stretched by up to about 15% (1.15 times their unstressed length), the exact value depending on the details of the experiment.

Plugging these numbers into the above formula, and assuming that the density of carbon atoms in the relaxed state of the nanotube spring is the same as in graphite, one obtains an energy density of 11.25 mega-Joule per liter. This is more than ten thousand times the energy density of steel springs, and even more than can be attained with today's electro-chemical batteries. Nanotube springs composed of other kinds of atoms, for example boron and nitrogen, can achieve similar energy densities.

The overall energy density will be lower in a complete system which includes the additional machinery needed to apply the large forces required to deform an array of nanotubes and to recover the energy thereby stored. In addition, since the amount of energy that can be stored in single nanotube molecules is tiny, this machinery must be able to deform a great many nanotubes in parallel in order to store a macroscopically significant amount of energy. A third requirement is that the components must operate with high mechanical and electrical efficiency, for example, with minimal friction and minimal stray capacitive couplings to the surroundings. These practical requirements pose enormous engineering challenges. Nevertheless, the huge improvements over other forms of mechanical energy storage which the remarkable material properties of nanotubes promise clearly justifies the efforts required, and it is certainly possible to build devices which can store and recover measurable amounts of energy from nanotube springs today.

The invention presents some practical realizations of such devices which can be built by one skilled in the art of MEMS (Micro-Electro-Mechanical Systems) design and fabrication. They are distinguished first by the structure of the nanotube spring, second by the ways in which the individual nanotubes are deformed, third by the forces utilized to deform the nanotubes, and lastly by the overall size of the nanotube spring and associated machinery. In all cases the nanotubes are assumed to be densely packed within the springs, and to deform together in a highly ordered fashion without collisions or large frictional loses. Assemblies of nanotubes which possess these properties to a significant degree are well known to one skilled in the art of nanotube synthesis.

FIGS. 1A-1C show an exemplary embodiment of the invention. Referring first to FIG. 1A, one or more nanotubes 1 are attached at both ends to the tips of two cylindrical screws, labeled as 2 and 3, which are threaded with opposite handedness. For convenience of manufacture, the exemplary atomic composition of the nanotubes 1 is carbon, and the preferred atomic composition of the screws is crystalline silicon, although many other atomic compositions are possible for both the screws and the nanotubes. To be concrete, the nanotube assembly shown in FIGS. 1A and 1B is a multi-walled nanotube consisting of a plurality of concentric single-walled nanotubes, although the exact form of the nanotube assembly used is not as important.

The exemplary nature of the attachment between the screws and the nanotubes is to form covalent chemical bonds between them, for example carbon-silicon bonds similar to those in silicon carbide as these bonds are strong enough to allow substantial strain to be applied to the nanotube without breaking. In the event that the nanotube(s) are multi-walled, all layers must be covalently bonded to the screws. Possible methods of forming carbon-silicon bonds between a carbon nanotube and a proximal silicon crystal surface include electron beams to promote free radical formation, which has been shown to result in cross-linking between the CNTs of a CNT bundle, laser heating to promote eutectic bonding, or activation of silicon surfaces by coating them with a layer of covalently bonded hydrogen atoms, demonstrated for the attachment of small molecules to silicon surfaces.

The opposite ends of the screws 2 and 3 are attached to the rectangular blocks 4 and 5 respectively, which are inserted into the rectangular shafts of slightly larger dimensions 7 and 8 respectively, as indicated in the diagram. By this means the screws are prevented from being rotated or translated perpendicular to their common axes, while being allowed to translate freely parallel to their axis. The materials of which the blocks 4 and 5 are composed are of little consequence as long as they are strong, rigid and capable of strong attachment to the screws. In the following it will be assumed for concreteness that these blocks have been formed from a hardened epoxy known as SU-8, which is widely used in MEMS because of the ease with which three-dimensional structures can be formed from it by photolithography; it should be understood however many other, harder materials are also utilized in MEMS, and may lead to an energy storage device with higher maximum energy storage.

Strong attachment of the blocks to the screws is obtained by embedding the screws within a layer of liquid SU-8 6, using photolithography to selectively initiate the hardening reaction within the regions to form the blocks, and then washing away the unhardened SU-8 6 leaving the blocks behind with a portion of the screws embedded in them. For maximum strength of attachment, and to reinforce the rigidity of the block, the silicon screws should ideally be embedded very nearly through the entire lengths of their respective blocks; however, the regions of the screws contained within the blocks are not visible in the figure. The most convenient material in which to form the shafts 7 and 8 is once again hardened SU-8 6, which may further be used to hold all the immobile components of the device, and to form cavities in which the mobile components are free to move.

The nanotube or nanotubes 1 and attached ends of the screws 2 and 3 are contained within a cylindrical hole which passes entirely through the length of a mechanical cam 9. The two open ends of this hole are threaded to match the corresponding screws over a distance at least equal to the length of that portion of the screws not embedded within the blocks 4 and 5. By these means rotational motion of the cam 9 is converted into translational motion of the screws 2 and 3 in opposite directions parallel to the axis of the nanotube or nanotubes 1. When the cam 9 rotates in one direction the nanotube or nanotubes 1 are stretched, whereas during their relaxation back towards their unstretched equilibrium length the cam 9 rotates in the opposite direction.

The exemplary material for the cam 9 is a silicon carbide ceramic, both for its hardness, mechanical strength and convenience of manufacture. The preferred means of manufacturing the cam 9 is by firing a silicon-carbide slurry contained in a matching micromould, which may once again be manufactured by established methods familiar to one skilled in the art. Note the asymmetry of the cam 9 has been exaggerated in FIG. 1A for the sake of clarity; in the actual device it would be on the order of a few percent, depending on the strain achievable by the piezoelectric blocks 10, 11, 12 and 13, which will now be described.

In order to convert electrical energy into energy stored in the nanotube or nanotubes 5 by stretching them, the rotation of the cam is driven by the vibration of four piezoelectric blocks 10, 11, 12 and 13 positioned arranged symmetrically about the cam 9 and extending over its entire length, as shown in FIG. 1B. There is a multitude of piezoelectric materials available in MEMS, the most common of which and hence preferred for convenience of manufacture is PZT (lead zirconate titanate). What is important is that the two opposite blocks 10 and 11 vibrate synchronously and in-phase, that the other two opposite blocks 12 and 13 likewise vibrate synchronously and in-phase, while the vibrational phases of the blocks 10 and 11 differ from the vibrational phases of 12 and 13 by 90°. This arrangement of phases ensures that at least one of the piezoelectric blocks is always pushing inwards on the cam 9, thereby keeping a torque on it throughout its entire rotational cycle.

The alternating voltage source 19, along with the phase shifting circuitry 20 and associated wiring 18, induces the vibrations of these piezoelectric blocks 10 through 13. The direction of rotation is determined by the sign of the phase shift between the pairs of piezoelectric blocks 10, 11 and 12, 13. By these means electrical energy may be converted first into vibrational motion of the piezoelectric blocks 10 through 13, second into rotation of the cam 9, third into translation of the screws 2 and 3 and their attached blocks 4 and 5, and finally into potential energy stored in the nanotube spring 1. When the nanotube or nanotubes 1 are stretched to the maximum extent consistent with the capabilities of the device, the rectangular blocks 4 and 5 together with their attached screws 2 and 3 respectively are blocked from further translation by means of the wedges 14, 15, 16 and 17 embedded in the walls of the shafts 7 and 8. Once the wedges have been inserted into the shaft just above the rectangular blocks 4 and 5, the voltage source may be turned off, and the energy remains stored in the deformation of the nanotube spring 1.

The propulsion of these wedges 14, 15, 16 and 17 into the shafts 7 and 8 can be accomplished by an electrostatic comb drive, as indicated symbolically by the trident-like structures adjacent the wedges in FIG. 1, although many of the actuation mechanisms commonly found in MEMS devices could also be utilized. In order to extract the stored energy, the voltage source is momentarily turned back on to drive the blocks 4 and 5 back against the bottom of their shafts 7 and 8 respectively. This relieves the pressure of the blocks 4 and 5 on the wedges 14, 15, 16 and 17, which are then withdrawn from the shafts 7 and 8 allowing force exerted by the stretched nanotube or nanotubes 1 on the screws to draw the screws 2 and 3 back into the cam 9 thereby causing the cam to rotate. The pressure exerted by the cam 9 on the piezoelectric blocks 10, 11, 12 and 13 in turn causes them to vibrate, generating an alternating voltage that may be conducted via the wires 18 to the associated electronics and ultimately to power an external electronic device.

FIG. 1B is a perpendicular view of the cutaway region shown in FIG. 1A. FIG. 1C shows a 3D view of the screw 3 extending from the rectangular block 5 in shaft 8.

If the multi-walled nanotube depicted in FIG. 1A is 100 nanometers in diameter, then the proportions of the components as drawn imply that the blocks 4 and 5 traverse a distance of approximately 400 nanometers in moving from the top to the bottom of their respective shafts 7 and 8. Since high-quality (low defect) nanotubes can be stretched by up to about 15% without any permanent alteration in their chemical structures, the device shown can be charged and discharged an essentially arbitrary number of times without loss of functionality providing that the multi-walled nanotube 1 is (400+400)/0.15=5333 nanometers or more in length. Wear due to friction between the non-nanotube components of the device should be alleviated by means of a suitable lubricating fluid, for example a perfluoropolyether.

If the multi-walled nanotube 1 is 5333 nanometers long and fills a cylinder 100 nanometers in diameter with carbon atoms at the same density as in graphite, straightforward calculations based on the widely accepted Young's modulus for carbon nanotubes of one tera-Pascal implies that the device will store about 2.4 nano-Joule of energy. This energy will scale cubically with the size of the device, assuming that the relative dimensions of its components are kept constant.

Alternatively, a large array of devices interconnected by wires can be used to store an amount of energy which grows linearly with the number of such devices, which in turn is proportional to the volume they occupy, or cubic in the linear dimensions of the device array. These two routes towards increasing the total amount of energy stored may be used together, with the exact combination to be determined by a multi-objective optimization tailored to the specific application.

Once the device has been charged and the wedges 14, 15, 16 and 17 inserted into the shafts 7 and 8, the rate at which energy is lost will be zero for all practical intents and purposes at normal room temperatures and pressures. The overall efficiency with which energy can be stored in and recovered from such a device will be determined by mechanical friction, electrical load matching and capacitive coupling to the environment during charging and discharging. The magnitude of the effects of friction and capacitive couplings will tend to decrease compared to the generating capacity of the device as the overall device is scaled upwards to larger sizes.

Countering this desirable trend is the challenge of manufacturing atomically precise nanotubes or nanotube assemblies of increasing dimensions, which is needed to obtain a nanotube-based spring with a large energy storage capacity. The scale of the device indicated in FIG. 1A is suitable for a multi-walled carbon nanotube like those which are obtained from today's state-of-the-art synthetic methods, but is at the extreme lower end of what could be manufactured using today's MEMS technology. The invention requires either the manipulation of single nanotube molecules with nanoscale precision, as in FIG. 1A, or else the formation of a highly ordered, macroscopic or near-macroscopic, assembly of multiple nanotube molecules, usually although not necessarily aligned in parallel. Here, the term "highly ordered" means that the regularity of the assembly persists all the way from the nanoscale structures of the constituent nanotube molecules up to the macroscopic or near-macroscopic structure of the assembly as a whole. The fact that carbon nanotubes with lengths at the millimeter scale have recently been synthesized will facilitate the manufacture of such nanotube assemblies.

Figure 2B:
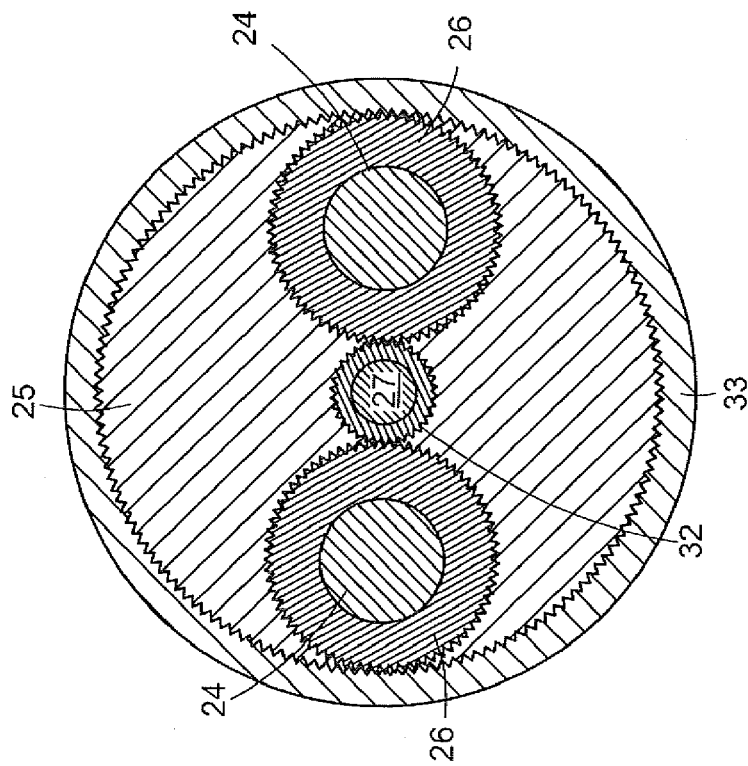
FIGS. 2A-2D are schematic diagrams illustrating an EMT based on electrostatic forces in the process of stretching, bending, and twisting a bundle of single-walled nanotube molecules about a spindle.
Figure 2A:
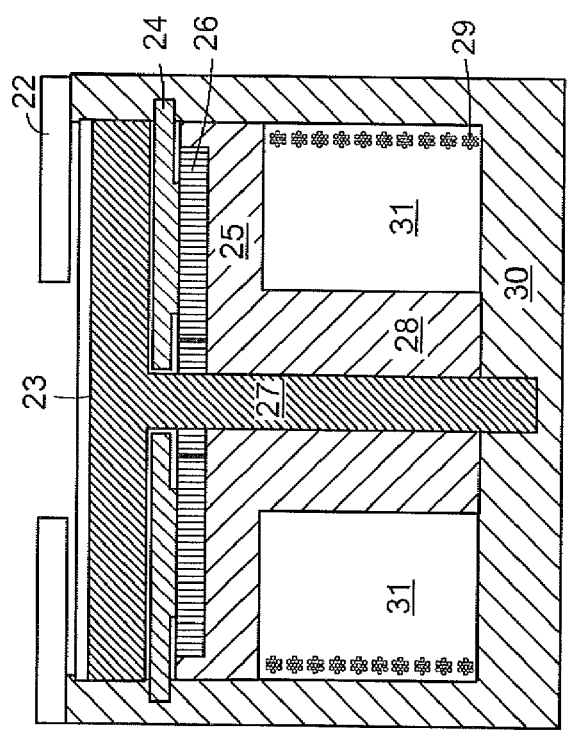

FIGS. 2A-2D shows an alternative embodiment which subjects multiple nanotube or nanotube assemblies to a more complicated deformation which includes bending and twisting in addition to stretching, and which uses a rotary electrostatic EMT (motor and generator) based on a stable electret (electrically charged) material. FIG. 2A shows a cut-away side-view through the center of the complete embodiment. This embodiment uses an array 29 of between twenty (as in drawings) and several thousand nanotube springs, which by way of example are taken here to be bundles of parallel single-walled carbon nanotubes held together by their intrinsic van der Waals attractions, although other atomic compositions and/or nanotube assemblies are possible.

As in the preferred embodiment, all the nanotubes in each bundle 29 are held in place by chemical bonding at one end to the rotating head of a spindle 25, and at the other end to the fixed bottom of a cavity 31 in a silicon wafer substrate 30 containing the spindle. The rotation of the spindle head 25 and shaft 28 within the cavity is coupled to the rotation of the head 23 and shaft 27 of the rotor of the electrostatic EMT by a gear train contained within a shallow cavity in the top of the spindle head 25 itself. The gear ratios must be chosen so that the torque exerted by the rotor head 23 and shaft 27 on the spindle head 25 and shaft 28 is sufficient to stretch, bend and twist the nanotube spring 29 array. Similarly, when the nanotube spring array is allowed to relax, the gear train must cause the rotor of the electrostatic EMT to spin at a higher speed than the spindle, with the exact ratio chosen so that the mechanical energy imparted to the spindle by the nanotube springs 29 and converted via the gear train into rotational energy of the rotor will be converted by the EMT into electrical energy with good efficiency.

The gear train is shown in FIG. 2B. A small gear 32 attached to the rotor shaft 27 where it comes out of the hole through the center of the spindle shaft drives two larger gears 26, which rotate about an inner cylinder 24 of the epoxy SU-8 which protrudes down from a fixed layer 24 of SU-8 which fills the space between the spindle head 25 and the rotor head 23. This filler layer 24 is held fixed with respect to the silicon substrate 30 by adhering to the sides of the cavity 31, but does not make contact with either the rotor head 23 or the spindle head 25. These two drive gears 26 in turn drive the spindle via a larger gear built into the inside face of a flange 33 on the top of the spindle head 25, as indicated in FIG. 2B and again in FIG. 2D.

Figure 2D:
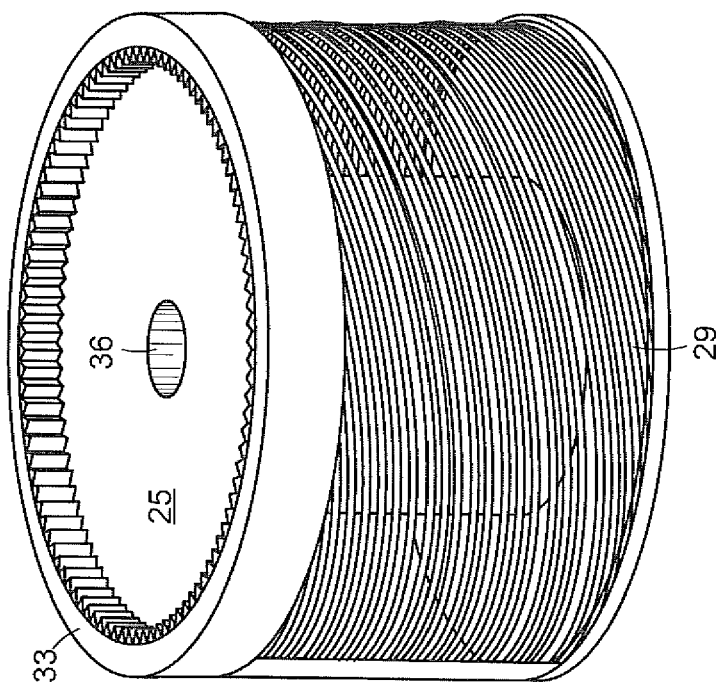
Figure 2C:
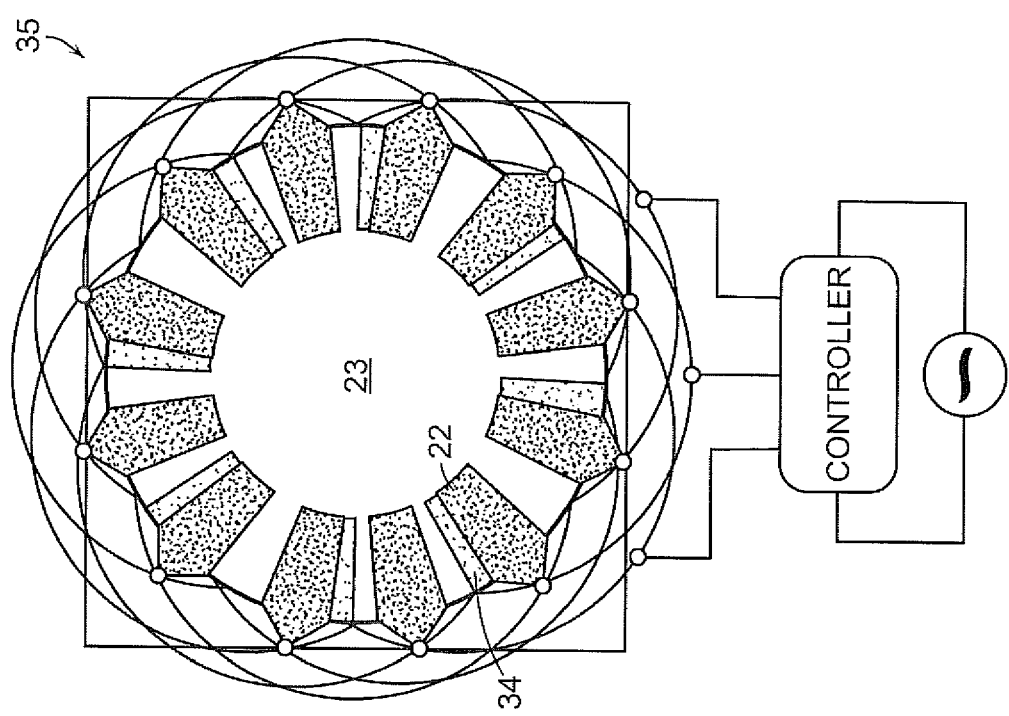

Purely by way of example, the rotary electrostatic EMT 35 illustrated in FIG. 2C is taken to be a twelve-electrode 22, three-phase device with eight permanently charged "electrets" 34 embedded at a Teflon/Aluminum interface on the rotor head 23, similar to others reported in the engineering literature. Many other rotary electrostatic EMTs are however well known by those skilled in the art of MEMS. Although the stator electrodes 22 are shown standing free over the top of the cavity 31 in FIG. 2A and FIG. 2C, in practice they would be embedded in an additional support layer formed from, for example, SU-8 on top of the silicon substrate 30 for additional strength (not shown).

The spatial arrangement of the nanotube springs 29 in their relaxed state is shown in the three-dimensional drawing of FIG. 2D, wherein the hole 36 through the spindle shaft 28 within which the rotor shaft 27 turns is also visible. In their relaxed arrangement, there is a residual stress due to their curvature which causes the individual nanotube springs 29 to separate from one another and to press outwards against the walls of the cavity 31. As the spindle begins to turn and to deform the nanotube springs 29 from their relaxed arrangement, the nanotube springs will be primarily twisted and bent without stretching, as they decrease their radius of curvature and are drawn inwards towards the spindle shaft 28. After a few turns of the spindles 25 and 28 the nanotube springs 29 will reach the surface of the spindle shaft 28, after which they will not be further bent but instead stretched by further rotation of the spindle. This is desirable since nanotubes can be bent only so far without buckling, which would greatly decrease their ability to store energy and may even result in physical damage to the nanotubes. Both before and after the nanotube springs 29 have reached the surface of the spindle shaft 28, every turn of the spindle head 25 applies one full turn of twist to the nanotube springs, further increasing the amount of stored energy.

The exact scale of the overall device will be determined by a variety of physical constraints, in particular the number and dimensions of the available nanotube springs, but is expected to be of order twenty five microns in both diameter and height if only twenty bundles of nanotubes tens of nanometers in diameter are used, and could be as large as twenty five hundred microns if thousands of bundles microns in diameter and several millimeters in length are available.

Figure 3A:
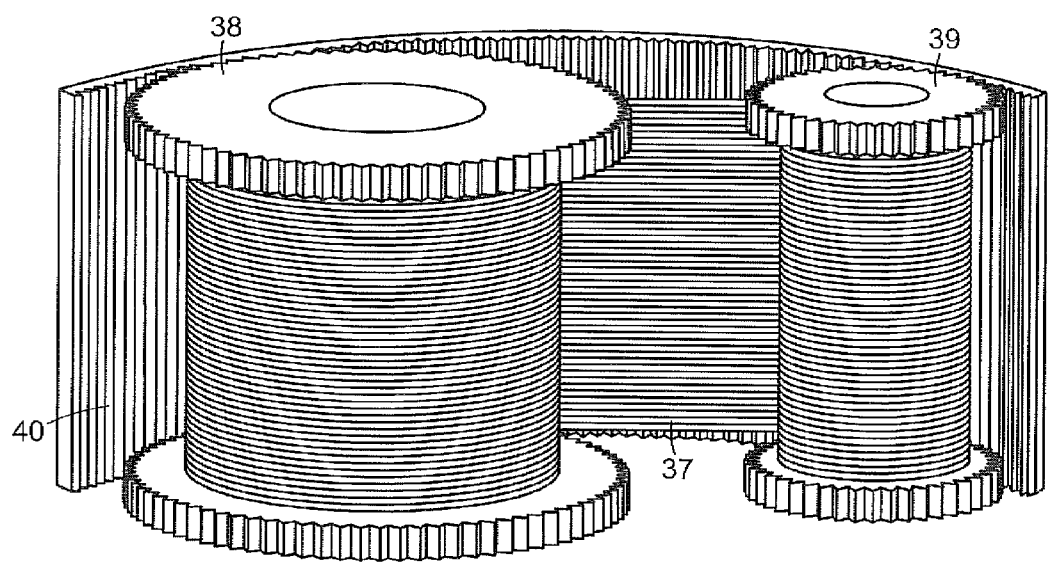
FIGS. 3A-3C are schematic diagrams illustrating a ribbon assembly of single-walled nanotube molecules being wound from a large to a smaller spool by an EMT based on magnetic forces thereby bending the nanotubes to a greater degree.
Figure 3B:
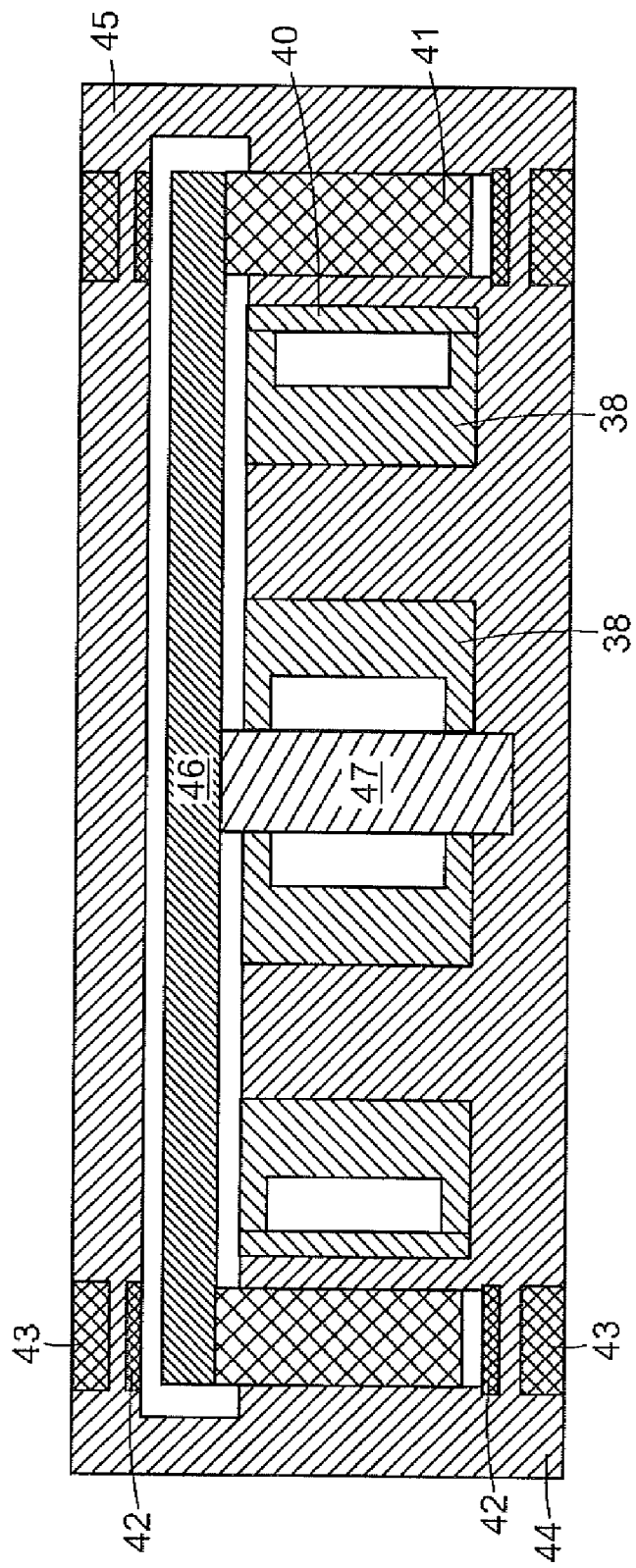
Figure 3C:
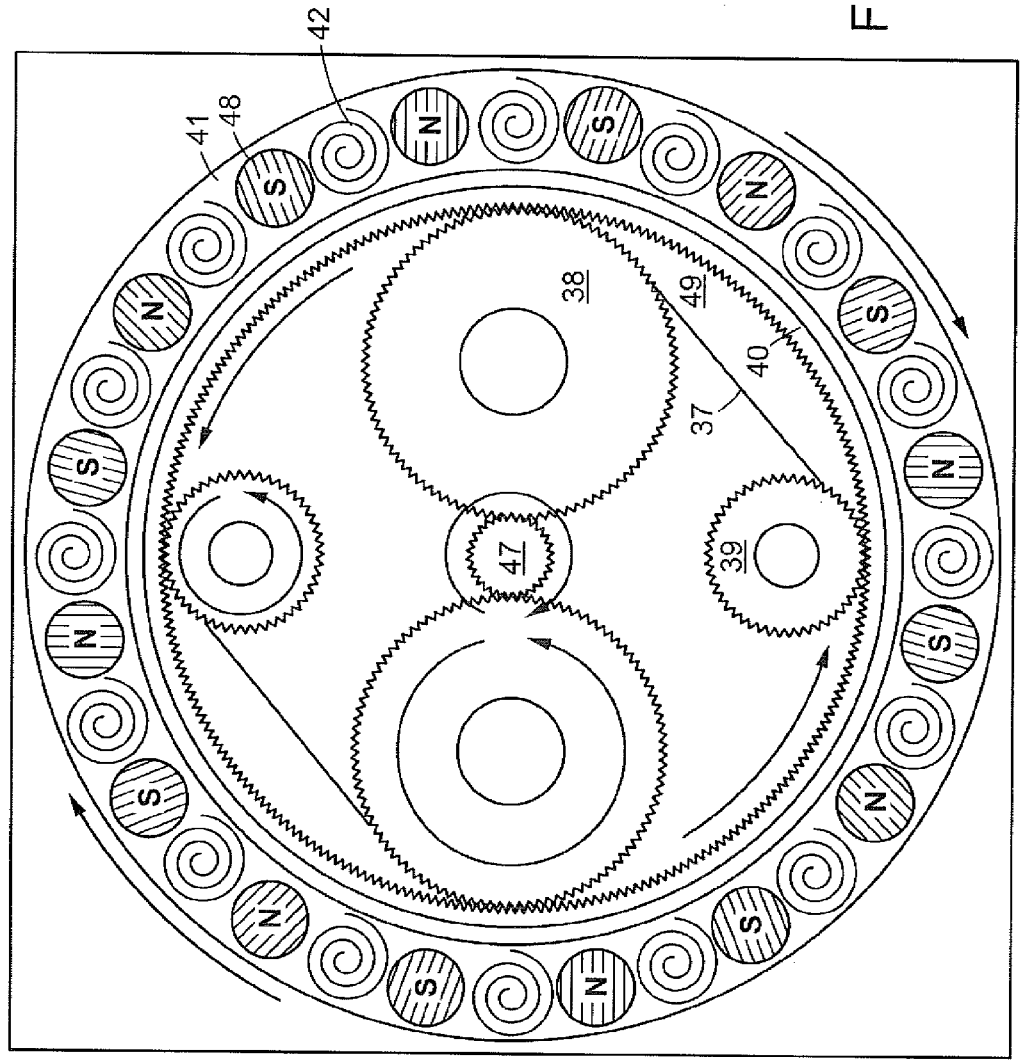

FIGS. 3A-3C show a second alternative embodiment, which is based on an electromagnetic EMT coupled to a spring consisting of a ribbon of aligned nanotubes. Purely by way of example, this ribbon is assumed to consist of aligned single-walled carbon nanotubes, which are known to form such ribbons in a strong magnetic field and to remain held together as a ribbon by van der Waals forces after the magnetic field is removed.

FIG. 3A shows a three-dimensional view of such a ribbon assembly of nanotubes 37. The ribbon 37 is attached at one end to a large spool 38 and at the other to a small spool 39, which are connected by gears at the top and bottom of both spools to the same power train gear 40 so that the rate at which the ribbon leaves one spool matches the rate at which it is taken up by the other. This arrangement, which is well known to one skilled in the art of mechanical energy storage, has the advantage of maintaining a constant torque on the power train 40 as the ribbon 37 is wound from the large 38 to the small spools 39, storing energy in the bending of the nanotubes. As in the first alternative embodiment, the gear ratios will have to be tuned to optimize the performance of the device, and may not be the same as shown the drawings.

A cut-away view through the side of the complete energy storage device is shown in FIG. 3B, and a cut-away view of the top just below the rotor head 46 is shown in FIG. 3C. The EMT rotor wing 41 surrounds two spool pairs 38 and 39, where each of these two spool pairs has a separate nanotube ribbon rolled between them (two ribbons in the complete device, as seen in FIG. 3C) The EMT includes the permanent magnets 48 with alternating polarities embedded in the rotor wing 41, which interact with aligned pairs of induction coils 42 above and below the rotor wing, where those above are supported a silicon wafer 45 bonded to the top of the substrate wafer 44. Above and below the induction coils in turn are regions of a soft magnetic material 43 (e.g. iron), which serve to amplify and direct the magnetic field from the coils 42. The rotor wing 41 merges into the periphery of the disk of the rotor head 46, which is supported by a rotor shaft 47 extending down from the center of the head into a matching cylindrical depression at the bottom of the cavity 49 in the silicon substrate wafer 44 which contains the nanotube ribbons 37, the two pairs spools 38 and 39, and the power train gear 40. For convenience of manufacture, the entire rotor is assumed here to be constructed from a continuous piece of poly-crystalline silicon, although many of the other materials common in MEMS could be used.

Gear teeth etched into the rotor drive shaft 47 at appropriate heights cause the spools in each spool pair to wind the nanotube ribbons 37 from the larger diameter 38 to the smaller diameter 39 spool when the EMT is operated as a motor, thereby storing the electrical energy used to drive the EMT in the bending of the nanotube ribbons 37. When the nanotube ribbons 37 are allowed to spontaneously unwind from the smaller 39 and wind onto the larger 38 spool in order to discharge the stored energy, the large spools 38 impart a torque to the rotor shaft 47 which in turn causes the EMT to function as a generator, with the result that the stored energy is recovered in the form of electricity. The directions of rotation of the various components are indicated by the curved arrows in FIG. 3C; the associated control and power electronics have been omitted for simplicity, but may readily be added by one skilled in the art of building electrical motors and generators.

As in all the embodiments herein described, the overall scale of this device will be determined by a optimization of its performance characteristics, given the size and strength of the available CNT ribbons and the physical properties of the materials chosen, but given the dimensions of presently available CNT ribbons is expected to be in the range of 0.5 to 50 millimeters.

The invention can be used to form a class of energy storage devices which use small electro-mechanical transducers (EMTs), conveniently though not necessarily built using MEMS manufacturing techniques, as electric motors to apply mechanical stress to a single- or multi-walled nanotube, or multi-molecular assembly of such, thereby converting electrical energy into energy stored in the resulting nanotube strain. This energy may be recovered by allowing the single or multi-walled nanotube, or multi-molecular assembly of such, to relax back to its equilibrium geometry while driving the EMT in reverse, so it also serves as an electric generator which delivers power to an external load.

The nanotube strain may be co-axial stretching or compression, bending in a plane perpendicular to the local nanotube axis, or twisting of the nanotube about its axis. The EMT motor-generator can be based upon electromagnetic or electrostatic forces, upon the piezoelectric effect, or upon less common but still well understood kinds of EMTs such as magneto-hydrodynamic. Depending on the application, the stored energy may also be recovered without using an EMT at all, by allowing the single or multi-walled nanotube, or multi-molecular assembly of such, to relax back to its equilibrium geometry while driving an external mechanical load directly, such as power tool, wheel chair, scooter or other motor vehicle.

Although the present invention has been shown and described with respect to several preferred embodiments thereof, various changes, omissions and additions to the form and detail thereof may be made therein without departing from the spirit and scope of the invention.

What is claimed is:

1. An energy storage device comprising;
    at least one nanotube structure having one nanotube, a multi-molecular assembly of interacting nanotubes, an array of non-interacting nanotubes, or non-interacting assemblies of interacting nanotubes, said at least one nanotube structure being independent of electric charge or current; and
    an energy storage, maintenance, and recovery mechanism for converting energy that is external to said energy storage device into potential energy by applying strain on said at least one nanotube structure, maintaining said potential energy of strain for an arbitrary period of time, with no losses due to friction, by fixating said at least one nanotube structure in a non-moving state, and converting said potential energy of strain back into external energy by relaxing said strain on said at least one nanotube structure.

2. The energy storage device of claim 1, wherein said potential energy is produced by an electro-mechanical transducer capable of serving as an electric motor, and said potential energy drives an electro-mechanical transducer capable of serving as an electric generator.

3. The energy storage device of claim 2, wherein said energy storage, maintenance and recovery mechanism utilizes piezoelectric, electrostatic or electromagnetic processes.

4. The energy storage device of claim 2, wherein said energy storage, maintenance and recovery mechanism applies strain by stretching, bending, twisting and/or compressing said at least one nanotube structure.

5. The energy storage device of claim 2, wherein said energy storage, maintenance and recovery mechanism is driven by the relaxation of strain in said at least one stretched, bent, twisted and/or compressed nanotube structure.

6. A method of forming an energy storage device comprising:
    providing at least one nanotube structure having one nanotube, a multi-molecular assembly of interacting nanotubes, an array of non-interacting nanotubes, or non-interacting assemblies of interacting nanotubes, said at least one nanotube structure being independent of electric charge or current; and
    forming an energy storage, maintenance, and recovery mechanism for converting energy that is external to said energy storage device into potential energy by applying strain on said at least one nanotube structure, maintaining said potential energy of strain for an arbitrary period of time, with no losses due to friction, by fixating said at least one nanotube structure in a non-moving state, and converting said potential energy of strain back into external energy by relaxing said strain on said at least one nanotube structure.

7. The method of claim 6, wherein said potential energy is produced by an electro-mechanical transducer capable of serving as an electric motor, and said potential energy drives an electro-mechanical transducer capable of serving as an electric generator.

8. The method of claim 7, wherein said energy storage, maintenance and recovery mechanism uses piezoelectric, electrostatic or electromagnetic processes.

9. The method of claim 7, wherein said energy storage, maintenance and recovery mechanism applies strain by stretching, bending, twisting and/or compressing said at least one nanotube structure.

10. The method of claim 7, wherein said energy storage, maintenance and recovery mechanism is driven by the relaxation of strain in said at least one stretched, bent, twisted and/or compressed nanotube structure.

11. A method of converting energy external to an energy storage device comprising:
    providing at least one nanotube structure having one nanotube, a multi-molecular assembly of interacting nanotubes, an array of non-interacting nanotubes, or non-interacting assemblies of interacting nanotubes;
    providing strain on said at least one nanotube structure to produce stored energy, said stored energy is maintained in the form of potential energy, with no losses due to friction, by fixating said nanotube structure in a non-moving state; and said stored energy is recovered using the elasticity of said at least one nanotube structure to release the strain.

12. The method of claim 11, wherein said strain involves stretching, bending, twisting and/or compressing said at least one nanotube structure.

13. The method of claim 12, wherein the potential energy stored in the form of strain on said at least one nanotube structure will be produced by piezoelectric, electrostatic or electromagnetic processes.

14. The method of claim 12, wherein the potential energy stored in the form of strain on said at least one nanotube structure will be recovered by piezoelectric, electrostatic or electromagnetic processes.

15. The methods of claim 13, wherein said piezoelectric, electrostatic or electromagnetic process occurs within a MEMS device.

16. The methods of claim 14, wherein said piezoelectric, electrostatic or electromagnetic process occurs within a MEMS device.

* * * * *